United States Patent [19]

Proebsting

[11] Patent Number: 4,716,380

[45] Date of Patent: Dec. 29, 1987

[54] FET DIFFERENTIAL AMPLIFIER

[75] Inventor: Robert J. Proebsting, Dallas, Tex.

[73] Assignee: Thomson Components-Mostek Corporation, Carrollton, Tex.

[21] Appl. No.: 633,375

[22] Filed: Jul. 23, 1984

Related U.S. Application Data

[63] Continuation of Ser. No. 430,226, Sep. 30, 1982, abandoned, which is a continuation of Ser. No. 119,873, Feb. 8, 1980, abandoned.

[51] Int. Cl.[4] .............................................. H03F 3/45
[52] U.S. Cl. .................................... 330/253; 330/257; 330/277; 307/356
[58] Field of Search ...................... 330/253, 257, 277; 307/350, 355, 356, 363, 530

[56] References Cited

U.S. PATENT DOCUMENTS

| | | | |
|---|---|---|---|
| 3,967,208 | 6/1976 | Baylac et al. | 330/277 X |
| 4,240,039 | 12/1980 | Mihalich | 330/253 |
| 4,243,945 | 1/1981 | Eckert | 330/253 |
| 4,247,824 | 1/1981 | Hilbourne | 330/253 |

OTHER PUBLICATIONS

Tsivids et al, "An Integrated NMOS Operational Amplifier with Internal Compensation", *IEEE Journal of Solid-State Circuits*, vol. SC-11, No. 6, Dec. 1976, pp. 748-753.

*Primary Examiner*—James B. Mullins
*Attorney, Agent, or Firm*—Roland Plottel; Richard S. Roberts

[57] ABSTRACT

A differential amplifier (10) has two input terminals (16,18), an output terminal (20) together with power terminals (12,14). The differential amplifier comprises two or more stages with each stage having a pull-up transistor (22) and a pull-down transistor (26). The first input terminal (16) is connected to alternate stages of the amplifier (10) and the second input terminal (18) is connected to the remaining alternate stages of the amplifier (10). The gain of the various stages is determined by fabrication of the transistors, in particular, the geometries of the transistor channels. A state transition at an output terminal (20) is produced when the voltages at the input terminals (16,18) are approximately equal and the gains of the various stages are essentially equal. A state change at the output terminal (20) is caused to occur when there is a given voltage offset between the voltages at the input terminal (16,18) when the gains of the two sets of alternate stages of the amplifier (10) are made unequal.

22 Claims, 3 Drawing Figures

FET DIFFERENTIAL AMPLIFIER

This is a continuation of application Ser. No. 430,226, filed Sept. 30, 1982, now abandoned, which is a continuation of application Ser. No. 119,873, filed Feb. 8, 1980, now abandoned.

TECHNICAL FIELD

The present invention pertains to electronic circuits and more particularly to such a circuit which functions as a differential amplifier.

BACKGROUND ART

Differential amplifiers are widely used in electronic circuits for such applications as voltage comparators, detector circuits, analog-to-digital conversion circuits and differential receivers. Heretofore a primary limitation on the operation of many differential amplifiers has been that the input voltages are constrained to operate in a region approximately halfway between the voltages at the power terminals which supply power to the differential amplifier. In general, as the voltages on the input terminals approach the supply voltage, the operation of a differential amplifier becomes degraded or terminates completely. Operation of a differential amplifier with input voltages above the supply voltage is difficult. This can be generally be carried out only with the use of voltage divider and voltage reduction circuits which buffer the input voltages to the differential amplifiers.

In view of the above limitations, there exists a need for a differential amplifier which functions when the voltages on the input terminals equal or exceed the supply voltage as well as when the input voltages are less than the supply voltage.

DISCLOSURE OF THE INVENTION

A multi-stage field effect transistor differential amplifier receives input signals through first and second input terminals, produces an output signal at an output terminal and is powered through first and second power terminals. The first stage comprises a first transistor, the gate terminal thereof connected to the first input terminal, the drain terminal thereof connected to the first power terminal, and the source terminal thereof connected to a first node, the first stage having a second transistor, the gate and drain terminals thereof connected to the first node and the source terminal thereof connected to the second power terminal, the gain of the second transistor greater than the gain of the first transistor. A second stage comprises a third transistor, the gate terminal thereof connected to the second input terminal, the drain terminal thereof connected to the first power terminal, and the source terminal thereof connected to a second node, said second stage including a fourth transistor, the gate terminal thereof connected to the first node, the drain terminal thereof connected to the second node and the source terminal thereof connected to the second power terminal, the gain of the fourth transistor greater than the gain of the third transistor. A third stage includes a fifth transistor, the gate terminal thereof connected to the first input terminal, the drain terminal thereof connected to the first power terminal and the source terminal thereof connected to a third node, the third stage including a sixth transistor, the gate terminal thereof connected to the second node, the drain terminal thereof connected to the third node and the source terminal thereof connected to the second power terminal, the sixth transistor having greater gain than the fifth transistor. A fourth stage has a seventh transistor, the gate terminal and drain terminal thereof connected to the first power terminal and the source terminal thereof connected to the output terminal, the fourth stage including an eighth transistor, the gate terminal thereof connected to the third node, the drain terminal thereof connected to the output terminal and the source terminal thereof connected to the second power terminal, the eighth transistor having greater gain than the seventh transistor.

BRIEF DESCRIPTION OF THE DRAWINGS

For a more complete understanding of the invention and the advantages thereof, reference is now made to the following description taken in conjunction with the accompanying drawings in which.

DETAILED DESCRIPTION OF THE INVENTION

Figure 1:
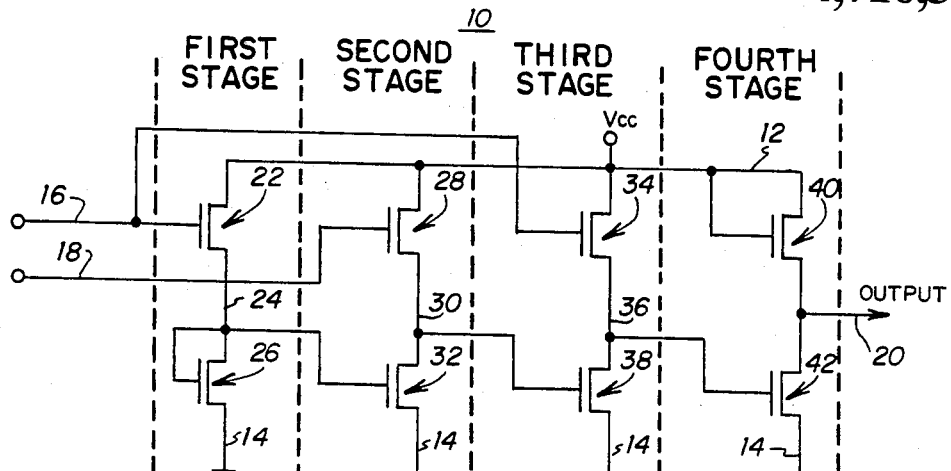
FIG. 1 is a schematic illustration of a differential amplifier in accordance with the present invention.

Referring now to the FIGURES where like reference numerals refer to like circuit elements, FIG. 1 illustrates the preferred embodiment of a differential amplifier in accordance with the present invention. A differential amplifier 10 is supplied with power through a first power terminal 12 and a second power terminal 14 which is shown as a ground in this embodiment. The first power terminal is designated as Vcc and is typically 5.0 volts.

Circuit 10 is provided with a first input terminal 16 and a second input terminal 18 for receiving input signals. The output signal of amplifier 10 is produced at an output terminal 20.

Amplifier 10 comprises four serially connected stages designated as first, second, third and fourth with each stage comprising the respective circuitry between the vertical dotted lines in FIG. 1.

Stage 1 includes a first transistor 22 which has a gate terminal thereof connected to the first input terminal 16 and the drain terminal thereof connected to the first power terminal 12. The source terminal of transistor 22 is connected to a node 24. A second transistor 26 in stage 1 has the gate and drain terminals thereof connected to node 24 and the source terminal thereof connected to ground, the second power terminal 14.

The second stage includes a transistor 28 which has the gate terminal thereof connected to the second input terminal 18 and the drain terminal thereof connected to the first power terminal 12. The source terminal of transistor 28 is connected to a node 30. The second stage includes a transistor 32 having the gate terminal thereof connected to node 24 and the drain terminal thereof connected to node 30. The source terminal of transistor 32 is connected to the second power terminal 14.

The third stage of amplifier 10 includes a transistor 34 having the gate terminal thereof connected to the first input terminal 16 and the drain terminal thereof connected to the first power terminal 12. The source terminal of transistor 34 is connected to a node 36. A further transistor 38 is included in the third stage and has the gate terminal thereof connected to node 30 and the drain terminal thereof connected to node 36. The source terminal of transistor 14 is connected to the second power terminal 14.

The fourth stage of amplifier 10 includes a transistor 40 having the gate terminal and the drain terminal thereof connected to the first power terminal 12. The source terminal of transistor 40 is connected to the output terminal 20. The fourth stage includes a second transistor 42 which has the gate terminal thereof connected to node 36 and the drain terminal thereof connected to the output terminal 20. The source terminal of transistor 42 is connected to the second power terminal 14.

In a preferred form of the invention, the circuit shown in FIG. 1 is fabricated as an integrated circuit using MOS (Metal Oxide Semiconductor) technology. Each of the transistors in the circuit is a field effect transistor which, when fabricated on a substrate, has a selected transistor channel width and length. The length and width dimensions are important physical parameters in determining the conductivity and gain of the individual transistors. An increase in channel width causes a transistor to have greater gain. The circuits of the present invention are preferably fabricated in such a way that the individual transistors have equal channel lengths, but have differing widths, depending on the characteristics required for the individual transistor.

As shown in FIG. 1, circuit 10 is divided into a plurality of stages. In order to function as a useful differential amplifier, at least some of the stages must have some voltage gain. In each of the stages shown in circuit 10, the upper transistor, which has the drain terminal connected to the first power terminal 12, is designated as the pull-up transistor. The lower transistor in each stage, which has the source terminal thereof connected to the second power terminal 14, is designated as the pull-down transistor. The ratio of the channel width of the pull-down transistor to the channel width of the pull-up transistor is defined as the beta ratio. The voltage gain of an individual stage is proportional to the beta ratio for that stage. Depending upon a number of factors, the gain varies from a direct linear correspondence with beta ratio to the square root of beta ratio. The important concept is that with a beta ratio exceeding unit, the stage will have voltage gain.

The manner in which circuit 10 operates is dependent upon the fabrication widths of the transistors which in turn defines the gain for each of the stages. In a first form of the circuit shown in FIG. 10, the transistors 22, 28, 34 and 40 are fabricated to have equal transistor channel widths and the transistors 26, 32, 38 and 42 are also fabricated to have equal widths. However, the channel widths of the pull-down transistors 26, 32, 38 and 47 are fabricated to be greater than the widths of the pull-up transistors 22, 28, 34 and 40.

When equal voltages are applied to input terminals 16 and 18, each of the first three stages will be biased with equal voltages, therefore the voltages on nodes 24, 30 and 36 will be equal. In a preferred embodiment, this balance voltage on these nodes will be somewhere in the midrange between the voltages on the power supply terminals 12 and 14. When the voltage on input terminal 16 slightly exceeds that on terminal 18, transistor 22 will be rendered more conductive, thereby elevating the voltage on node 24. The increased voltage on node 24 is coupled to the gate terminal of transistor 32, thereby causing transistor 32 to be rendered more conductive, which pulls node 30 toward ground. The voltage shift on node 30 will be proportional to the product of the voltage change on node 24 and the gain of the second stage. Node 30 is connected to the gate terminal of transistor 38 and since the voltage on node 30 is becoming less, transistor 38 will be made less conductive, thereby elevating the voltage on node 36. Since the gate terminal of transistor 34 also receives the input voltage from terminal 16, transistor 34 will be rendered more conductive, thus tending to elevate the voltage on node 36 even more. The voltage change on node 36 is thus made greater by at least the factor of the gain of the third stage over the voltage change on node 30. The voltage on node 36 is applied to the gate terminal of transistor 42, thereby rendering transistor 42 substantially more conductive than in the balanced condition. As the impedence between the drain and source terminals of transistor 42 becomes less, the output terminal 20 will be drawn toward ground. The extent of voltage change on node 20 is likewise at least equal to the product of the voltage change on node 36 and the gain of the fourth stage, provided the output voltage is not driven to the limit of the supply range. Thus, as the voltage applied to the input terminal 16 is made more positive than the voltage applied to input terminal 18, the voltage on the output terminal 20 will be driven to a first state which is less than that which is present with a balanced input condition.

If for the embodiment of circuit 10 described above, the voltage on input terminal 16 is made negative relative to the voltage on input terminal 18, as compared to the balanced condition, the transistor 22 will be rendered less conductive, thereby causing the voltage on node 24 to be driven down. When node 24 goes down, transistor 32 is rendered less conductive which tends to elevate the voltage on node 30. As noted above, the voltage change on node 30 is greater than the voltage change on node 24 by a factor which is approximately the gain of the second stage. As the voltage on node 30 goes higher, transistor 38 is rendered more conductive, thereby pulling the voltage on node 36 lower. The voltage change on node 36 will likewise be greater than the voltage change on node 30. As the voltage on node 36 becomes even lower, transistor 42 will be turned essentially off, thereby elevating the voltage on output terminal 20. Thus, if the voltage on input terminal 16 is less than the voltage on input terminal 18, the voltage at the output terminal 20 will be driven to a second state which is greater than the voltage that is present on output terminal 20 at the balanced condition.

If the gains for the stages for the embodiment described above are made sufficiently great, a small positive voltage differential on input terminal 16 over input terminal 18 will drive the voltage at the output terminal 20 to near 0 volts. And if the voltage on input 16 is made only slightly less than the voltage on input terminal 18, the output terminal 20 will be driven to within one transistor threshold voltage, $V_t$, within that of $V_{cc}$. Note that the output in circuit 10 is not dependent upon the absolute amplitudes of the voltages present at the input terminals 16 and 18, but is dependent only upon the amplitude and polarity of the voltage differential between the two input terminals. Further, if the stages are provided with sufficient gain, the voltage on the output terminal will essentially be switched between two levels, high and low, since it is difficult to provide exactly balanced inputs to the two input terminals.

In the differential amplifier shown in FIG. 1, the voltages supplied to the input terminals 16 and 18 are not constrained to be less than the supply voltage at terminal 12 in respect to terminal 14. The amplifier 10 continues to function in the manner described above even when the voltages at the input terminals are equal to or greater than the supply voltage. The ability to operate the differential amplifier with the input voltages at or above the supply voltage overcomes a major drawback heretofore encountered with most differential amplifiers in many applications. The circuit 10 can also operate when the voltages applied to the input terminals 16 and 18 are almost as low as two transistor threshold voltages above ground.

For the embodiment described above where all of the pull-up transistors have equal channel widths and all of the pull-down transistors have equal channel widths, the output voltage of the amplifier 10 will transition between the two voltage states when the input voltages become very slightly offset from each other. But in many applications, it is desirable to have the output transition occur when there is a fixed offset differential between the input voltages rather than equality of the input voltages. Such voltage offset can be achieved by altering the gain characteristics of the various stages of amplifier 10. If it is desired to have the output voltage transition occur when the voltage on input terminal 16 exceeds the voltage on input terminal 18 by a predetermined voltage differential, the gains of the first and third stages are made greater than the gains of the second and fourth stages. This is done by increasing the beta ratios for the first and third stages or by decreasing the beta ratios for the second and fourth stages. The first input voltage is applied to the first and third stages while the second input voltage is applied to the second and fourth stages. The circuit will thus be in balance when the voltage on the first input terminal exceeds the voltage on the second input terminal by the desired voltage differential. Should the voltage on the first input terminal 16 exceed the voltage on the second input terminal 18 by more than the desired voltage differential, the voltage on the output terminal will be driven to a first state, a low potential. But if the voltage on the first input terminal 16 does not exceed the voltage on the second input 18 by the amount of the voltage differential, the voltage on the output terminal 20 will be driven to a second state, a high potential.

If it is desired to produce a voltage transition at the output of the differential amplifier 10 when the voltage on the first input terminal 16 is less by a predetermined voltage differential from that of the voltage on input terminal 18, the gains of the first and third stages will be made lower than the gains of the second and fourth stages.

Note that in the above examples with the offset input voltages, the circuit 10 is still not constrained to operate with the input voltages below the supply voltage, and in fact can operate with the input voltages at or above the supply voltage.

Figure 2:
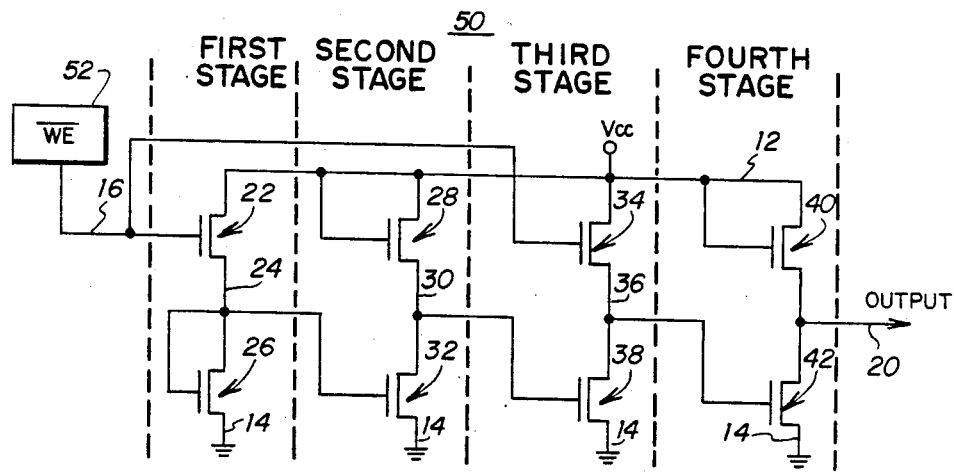
FIG. 2 is a schematic illustration of a voltage comparator which is a specific application of the differential amplifier illustrated in FIG. 1.

The most general form of the present invention is illustrated in FIG. 1 and a particular application of the circuit of FIG. 1 is shown in FIG. 2. Amplifier 50 shown in FIG. 2 corresponds essentially to the circuit 10 shown in FIG. 1 but with minor modifications. The changes in the circuit comprise connecting the first input terminal 16 to an integrated circuit terminal 52, which is designated as $\overline{WE}$. The second input terminal 18 is deleted and the circuit connection thereto is connected to the first power terminal 12. This latter change comprises connecting the gate terminal of transistor 28 to the power terminal 12. Otherwise, the circuit in FIG. 2 is identical to the circuit in FIG. 1.

The circuit illustrated in FIG. 2 is utilized as an integral part of an integrated semiconductor memory circuit which has a backup supply voltage which is applied to the $\overline{WE}$ terminal 52 as well as to the conventional power supply terminals 12 and 14. The object of the circuit is to produce a first state at the output terminal 20 when the voltage at the $\overline{WE}$ terminal does not exceed the voltage $V_{cc}$ by more than a predetermined differential, approximately 1 volt. When the voltage on the $\overline{WE}$ terminal 52 exceeds the voltage on the primary power terminal 12 by more than the voltage differential, the voltage on the output terminal 20 is to be driven to a second state.

From the above description of input voltage offset, it can be seen that the gain of the first and third stages must be made greater than the gain of the second and fourth stages. As designed with MOS technology, the channel widths for the transistors in circuit 50 are fabricated to have the dimensions shown in Table 1. The lengths of the channels are the same for each transistor, this length being approximately 3 microns.

TABLE 1

| TRANSISTOR | CHANNEL WIDTH (MICRONS) |
|---|---|
| 22 | 4 |
| 26 | 50 |
| 28 | 7 |
| 32 | 50 |
| 34 | 4 |
| 38 | 50 |
| 40 | 7 |
| 42 | 50 |

In the design case presented above for amplifier 50 in FIG. 2, the voltage at the output terminal 20 will be driven to a low state when the voltage on the $\overline{WE}$ terminal 52 exceeds the voltage on the power terminal 12 by more than approximately 1 volt, the voltage differential. The voltage on the output terminal 20 will be driven to a high state when the voltage on the $\overline{WE}$ terminal 52 is less than the voltage on the power terminal 12 or exceeds the voltage on the power terminal 12 by less than the 1.0 volt differential.

In the embodiments disclosed above for the differential amplifier of the present invention, there have been four stages of amplification. However, the circuit of the present invention can be implemented with as few as two stages. The differential amplifier of the present invention can be configured to have any number of stages in excess of two, including an odd number of stages. The number of stages utilized is primarily dependent upon the overall amount of gain required and the gain factor for each individual stage. The number of stages can also be selected so as to provide the desired polarity of output signal. Addition of one extra inverting stage to the output provides both true and complement outputs.

Figure 3:
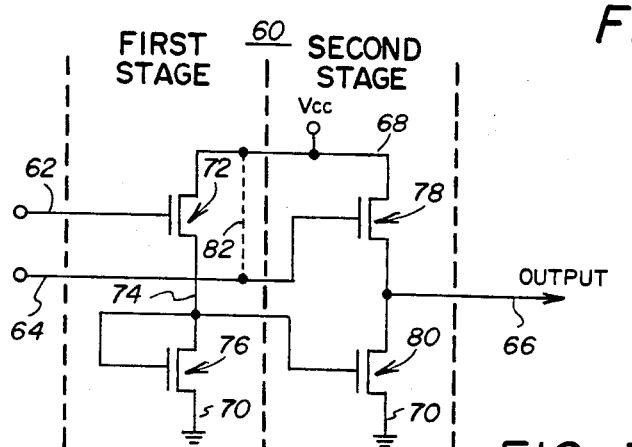
FIG. 3 is a schematic illustration of a minimum stage differential amplifier in accordance with the present invention.

A further embodiment of the present invention utilizing two stages is illustrated in FIG. 3. A two-stage differential amplifier 60 has first and second input terminals 62 and 64 and an output terminal 66. The amplifier 60 is supplied with power through power terminals 68 and 70.

The first stage of amplifier 60 includes a first transistor 72 having the gate terminal thereof connected to the first input terminal 62, the drain terminal thereof connected to the power terminal 68 and the source terminal thereof connected to a node 74. The first stage includes a transistor 76 having the gate and drain terminals thereof connected to node 74 and the source terminal thereof connected to power terminal 70.

The second stage in amplifier 60 includes a transistor 78 having the gate terminal thereof connected to the second input terminal 64, the drain terminal thereof connected to power terminal 68 and the source terminal thereof connected to the output terminal 66. A transistor 80 is further included in the second stage and has the gate terminal thereof connected to node 74, the drain terminal thereof connected to output terminal 66 and the source terminal thereof connected to power terminal 70.

The two stage differential amplifier 60 illustrated in FIG. 3 operates in the same manner as the first two stages of the differential amplifier 10 shown in FIG. 1. Amplifier 60 can be modified to be the equivalent of that shown in FIG. 2 by the addition of the dotted conductor 82 which interconnects the power terminal 68 to the second input terminal 64. With the interconnection 82, the differential amplifier 60 of FIG. 3 functions in essentially the same manner as the differential amplifier 50 shown in FIG. 2.

If the gain to the first and second stages of the amplifier 60 are essentially equal, then there will be no voltage offset between the voltages on the input terminals 62 and 64 at the time of a voltage transition at the output terminal 66. If the gain of the first stage is made greater than the gain of the second stage, the output voltage transition will occur when the voltage on input terminal 62 exceeds the voltage on input terminal 64 by a fixed differential. And if the gain of the second stage exceeds the gain of the first stage of amplifier 60, the output voltage transition will occur when the voltage on the second input terminal 64 exceeds the voltage on the first input terminal 62 by a fixed differential.

The fabrication of the circuit shown in FIG. 3 is identical to that described above for the other embodiments.

In summary, the present invention provides a differential amplifier preferably embodied in an MOSFET circuit and which responds to input voltages that can range up to and exceed the supply voltage. The circuit does not include any input voltage scalers or divider networks to accommodate the input voltages.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

I claim:

1. A field effect transistor differential amplifier which receives input signals through first and second input terminals, produces an output signal at an output terminal and is powered through first and second power terminals, comprising:

a first stage comprising a first transistor, the gate terminal thereof connected to said first input terminal, the drain terminal thereof connected to said first power terminal, and the source terminal thereof connected to a first node, said first stage having a second transistor, the gate and drain terminals thereof connected to said first node and the source terminal thereof connected to said second power terminal, the gain of said second transistor greater than the gain of said first transistor;

a second stage comprising a third transistor, the gate terminal thereof connected to said second input terminal, the drain terminal thereof connected to said first power terminal, and the source terminal thereof connected to a second node, said second stage including a fourth transistor, the gate terminal thereof connected to said first node, the drain terminal thereof connected to said second node and the source terminal thereof connected to said second power terminal, the gain of said fourth transistor greater than the gain of said third transistor;

a third stage including a fifth transistor, the gate terminal thereof connected to said first input terminal, the drain terminal thereof connected to said first power terminal and the source terminal thereof connected to a third node, said third stage including a sixth transistor, the gate terminal thereof connected to said second node, the drain terminal thereof connected to said third node and the source terminal thereof connected to said second power terminal, said sixth transistor having greater gain than said fifth transistor; and a fourth stage having a seventh transistor, the gate and drain terminals thereof connected to said first power terminal and the source terminal thereof connected to said output terminal, said fourth stage including an eighth transistor, the gate terminal thereof connected to said third node, the drain terminal thereof connected to said output terminal and the source terminal thereof connected to said second power terminal, said eighth transistor having greater gain than said seventh transistor.

2. The differential amplifier recited in claim 1 wherein said first, second, third and fourth stages have essentially equal gains whereby said output signal is driven to a first state when the voltage of said input signal at said first input terminal exceeds the voltage of said input signal at said second input terminal and said output signal is driven to a second state when the voltage of said input signal at said second input terminal exceeds the voltage of said input signal at said first input terminal.

3. The differential amplifier recited in claim 1 wherein said first and third stages have greater gain than said second and fourth stages whereby said output signal is driven to a first state when the voltage of said input signal at said first input terminal is greater than the sum of the voltage of said input signal at said second input terminal and a predetermined differential voltage and said output signal is driven to a second state when the voltage of said input signal at said first input terminal in less than the sum of the voltage of said input signal at said second input terminal and said predetermined differential voltage.

4. The differential amplifier recited in claim 1 wherein the gain of said second and fourth stages is greater than the gain of said first and third stages whereby said output signal is driven to a first state when the voltage of the input signal at said second input terminal is less than the sum of the voltage of said input signal at said first input terminal and a predetermined voltage differential and said output signal is driven to a second state when the voltage of said input signal at said second input terminal is greater than the sum of the voltage of the input signal at said first input terminal and said predetermined voltage differential.

5. The differential amplifier recited in claim 1 wherein the second input terminal is connected to the first power terminal.

6. The differential amplifier recited in claim 5 wherein said first and third stages have greater gain than said second and fourth stages whereby said output signal is driven to a first state when the voltage of said input signal at said first input terminal is less than the sum of the voltage at said first power terminal and a predetermined differential voltage and said output signal is driven to a second state when the voltage of said input signal at said first input terminal is greater than the sum of the voltage at said first power terminal and said predetermined differential voltage.

7. The differential amplifier recited in claim 1 wherein the first input terminal is connected to the first power terminal.

8. A field effect transistor differential amplifier which receives input signals through first and second input terminals, produces an output signal at an output terminal, and is powered through first and second power terminals, comprising:
 a first stage comprising a first transistor, the gate terminal thereof connected to said first input terminal, the drain terminal thereof connected to said first power terminal and the source terminal thereof connected to a first node, said first stage including a second transistor having the gate and drain terminals thereof connected to said first node and the source terminal thereof connected to said second power terminal, the gain of said second transistor greater than the gain of said first transistor;
 a second stage comprising a third transistor, the gate terminal thereof connected to said second input terminal, the drain terminal thereof connected to said first power terminal and the source terminal thereof connected to said output terminal, said second stage including a fourth transistor, the gate terminal thereof connected to said first node, the drain terminal thereof connected to said output terminal and the source terminal thereof connected to said second power terminal, the gain of said fourth transistor greater than the gain of said third transistor; and
 said first stage has greater gain than said second stage whereby said output signal is driven to a first state when the voltage of the input signal at said first input terminal is greater than the sum of the voltage of the input signal at said second input terminal and a predetermined voltage differential and said output signal is driven to a second state when the voltage of the input signal at said first input terminal is less than the sum of the voltages of the input signal at said second input terminal and said predetermined voltage differential.

9. A field effect transistor differential amplifier which receives input signals through first and second input terminals, produces an output signal at an output terminal, and is powered through first and second power terminals, comprising:
 a first stage comprising a first transistor, the gate terminal thereof connected to said first input terminal, the drain terminal thereof connected to said first power terminal and the source terminal thereof connected to a first node, said first stage including a second transistor having the gate and drain terminals thereof connected to said first node and the source terminal thereof connected to said second power terminal, the gain of said second transistor greater than the gain of said first transistor;
 a second stage comprising a third transistor, the gate terminal thereof connected to said second input terminal, the drain terminal thereof connected to said first power terminal and the source terminal thereof connected to said output terminal, said second stage including a fourth transistor, the gate terminal thereof connected to said first node, the drain terminal thereof connected to said output terminal and the source terminal thereof connected to said second power terminal, the gain of said fourth transistor greater than the gain of said third transistor; and
 said second stage has greater gain than said first stage whereby said output signal is driven to a first state when then voltage of the input signal at said second output terminal is less than the sum of the voltage of the input signal at said first output terminal and a predetermined voltage differential and said output signal is driven to a second state when the voltage of the input signal at said second input terminal is greater than the sum of the voltage of the input signal at said first input terminal and said predetermined voltage differential.

10. The differential amplifier recited in claim 9 wherein said first power terminal is connected to said second input terminal.

11. A field effect transistor differential amplifier which receives input signals through first and second input terminals, produces an output signal at an output terminal, and is powered through first and second power terminals, comprising:
 a first stage comprising a first transistor, the gate terminal thereof connected to said first input terminal, the drain terminal thereof connected to said first power terminal and the source terminal thereof connected to a first node, said first stage including a second transistor having the gate and drain terminals thereof connected to said first node and the source terminal thereof connected to said second power terminal, the gain of said second transistor greater than the gain of said first transistor;
 a second stage comprising a third transistor, the gate terminal thereof connected to said second input terminal, the drain terminal thereof connected to said first power terminal and the source terminal thereof connected to said output terminal, said second stage including a fourth transistor, the gate terminal thereof connected to said first node, the drain terminal thereof connected to said output terminal and the source terminal thereof connected to said second power terminal, the gain of said fourth transistor greater than the gain of said third transistor; and
 said first stage has greater gain than said second stage whereby said output signal is driven to a first state when then voltage of the input signal at said first input terminal is less than the sum of the voltage at said first power terminal and a predetermined voltage differential and said output signal is driven to a second state when the voltage of the input signal at said first input terminal is greater than the sum of the voltage at said first power terminal and said predetermined voltage differential.

12. A differential amplifier having first and second input terminals, an output terminal and first and second power terminals, the amplifier comprising a plurality of field effect transistors fabricated as an integrated circuit, the transistors having essentially equal channel lengths and organized into a plurality of stages including:

a first stage having a first transistor, the gate terminal thereof connected to said first input terminal, the drain terminal thereof connected to said first power terminal and the source terminal thereof connected to a first node, said first stage having a second transistor, the gate and drain terminals thereof connected to said first node and the source terminal thereof connected to said second power terminal, the channel width of said second transistor greater than the channel width of said first transistor;

a second stage having a third transistor, the gate terminal thereof connected to said second input terminal, the drain terminal thereof connected to said first power terminal and the source terminal thereof connected to a second node, said second stage having a fourth transistor, the gate terminal thereof connected to said first node, the drain terminal thereof connected to said second node and the source terminal thereof connected to said second power terminal, the channel width of said fourth transistor greater than the channel width of said third transistor;

a third stage having a fifth transistor, the gate terminal thereof connected to said first input terminal, the drain terminal thereof connected to said first power terminal and the source terminal thereof connected to a third node, said third stage having a sixth transistor, the gate terminal thereof connected to said second node, the drain terminal thereof connected to said third node and the source terminal thereof connected to said second power terminal, the channel width of said sixth transistor greater than the channel width of said fifth transistor; and a fourth stage having a seventh transistor, the gate terminal thereof connected to said first power terminal, the drain terminal thereof connected to said first power terminal and the source terminal thereof connected to said output terminal, said fourth stage having an eighth transistor, the gate terminal thereof connected to said third node, the drain terminal thereof connected to said output terminal and the source terminal thereof connected to said second power terminal, the channel width of said eighth transistor greater than the channel width of said seventh transistor.

13. The differential amplifier recited in claim 12 wherein the channel widths of said first, third, fifth and seventh transisters are essentially equal and the channel widths of said second, fourth, sixth and eighth transistors are essentially equal whereby said output terminal is driven to a first state when the voltage on said second input terminal exceeds the voltage on said first input terminal and said output terminal is driven to a second state when the voltage on said first input terminal exceeds the voltage on said second input terminal.

14. The differential amplifier recited in claim 12 wherein the ratio of the channel width of said second transistor to said first transistor and the ratio of said sixth transistor to said fifth transistor is greater than the ratio of the channel width of said fourth transistor to said third transistor and the ratio of said eighth transistor to said seventh transistor whereby said output terminal is driven to a first state when the voltage at said first input terminal exceeds the voltage at said second input terminal by a predetermined voltage differential and said output terminal is driven to a second state when the voltage at said first input terminal does not exceed the voltage at said second input terminal by said predetermined voltage differential.

15. The differential amplifier recited in claim 12 wherein the ratio of the channel width of said second transistor to said first transistor and the ratio of said sixth transistor to said fifth transistor is less than the ratio of the channel width of said fourth transistor to said third transistor and the ratio of said eighth transistor to said seventh transistor whereby said output terminal is driven to a first state when the voltage at said second input terminal does not exceed the voltage at said first input terminal by a predetermined voltage differential and said output terminal is driven to a second state when the voltage at said second input terminal exceeds the voltage at said first input terminal by said predetermined voltage differential.

16. The differential amplifier recited in claim 12 wherein said first power terminal is connected to said second input terminal.

17. The differential amplifier recited in claim 16 wherein the ratio of the channel width of said second transistor to said first transistor and said sixth transistor to said fifth transistor exceeds the channel width ratios of said fourth transistor to said third transistor and said eighth transistor to said seventh transistor whereby said output terminal is driven to a first state when the voltage on said first input terminal does not exceed the voltage on said first power terminal by a predetermined voltage differential and said output terminal is driven to a second state when the voltage on said first input terminal exceeds the voltage on said first power terminal by said predetermined voltage differential.

18. A differential amplifer having first and second input terminals, an output terminal and first and second power terminals, the amplifier comprising a plurality of field effect transistors fabricated as an integrated circuit, the transistors having essentially equal channel lengths and organized into a plurality of stages including:

a first stage having a first transistor, the gate terminal thereof connected to said first input terminal, the drain terminal thereof connected to said first power terminal and a source terminal thereof connected to a first node, said first stage having a second transistor the gate and drain terminals thereof connected to said first node and the source terminal thereof connected to said second power terminal, the channel width of said second transistor greater than the channel width of said first transistor;

a second stage having a third transistor, the gate terminal thereof connected to said second input terminal, the drain terminal thereof connected to said first power terminal and the source terminal thereof connected to said output terminal, said second stage having a fourth transistor, the gate terminal thereof connected to said first node, the drain terminal thereof connected to said output terminal and the source terminal thereof connected to said second power terminal, the channel width of said fourth transistor greater than the channel width of said third transistor; and the ratio of the channel width of said second transistor to said first transistor exceeds the ratio of the channel width of said fourth transistor to said third transistor whereby said output terminal is driven to a first state when the voltage at said first input terminal exceeds the voltage on said second input terminal by a predetermined voltage differential and said output terminal is driven to a second state when the voltage on said first input terminal does not exceed the voltage on said second input terminal by said predetermined voltage differential.

19. A differential amplifier having first and second input terminals, an output terminal and first and second power terminals, the amplifier comprising a plurality of field effect transistors fabricated as an integrated circuit, the transistors having essentially equal channel lengths and organized into a plurality of stages including:

a first stage having a first transistor, the gate terminal thereof connected to said first input terminal, the drain terminal thereof connected to said first power terminal and a source terminal thereof connected to a first node, said first stage having a second transistor the gate and drain terminals thereof connected to said first node and the source terminal thereof connected to said second power terminal, the channel width of said second transistor greater than the channel width of said first transistor;

a second stage having a third transistor, the gate terminal thereof connected to said second input terminal, the drain terminal thereof connected to said first power terminal and the source terminal thereof connected to said output terminal, said second stage having a fourth transistor, the gate terminal thereof connected to said first node, the drain terminal thereof connected to said output terminal and the source terminal thereof connected to said second power terminal, the channel width of said fourth transistor greater than the channel width of said third transistor; and the ratio of the channel width of said second transistor to said first transistor is less than the ratio of the channel width of said fourth transistor to said third transistor whereby said output terminal is driven to a first state when the voltage at said second input terminal exceeds the voltage on said first input terminal by a predetermined voltage differential and said output terminal is driven to a second state when the voltage on said second input terminal does not exceed the voltage on said first input terminal by said predetermined voltage differential.

20. The differential amplifier recited in claim 19 wherein said first power terminal is connected to said second input terminal.

21. A differential amplifier having first and second input terminals, an output terminal and first and second power terminals, the amplifier comprising a plurality of field effect transistors fabricated as an integrated circuit, the transistors having essentially equal channel lengths and organized into a plurality of stages including:

a first stage having a first transistor, the gate terminal thereof connected to said first input terminal, the drain terminal thereof connected to said first power terminal and a source terminal thereof connected to a first node, said first stage having a second transistor the gate and drain terminals thereof connected to said first node and the source terminal thereof connected to said second power terminal, the channel width of said second transistor greater than the channel width of said first transistor;

a second stage having a third transistor, the gate terminal thereof connected to said second input terminal, the drain terminal thereof connected to said first power terminal and the source terminal thereof connected to said output terminal, said second stage having a fourth transistor, the gate terminal thereof connected to said first node, the drain terminal thereof connected to said output terminal and the source terminal thereof connected to said second power terminal, the channel width of said fourth transistor greater than the channel width of said third transistor; and the ratio of the channel width of said second transistor to said first transistor exceeds the ratio of the channel width of said fourth transistor to said third transistor whereby said output terminal is driven to a first state when the voltage on said first input terminal does not exceed the voltage on said first power terminal by a predetermined voltage differential and said output terminal is driven to a second state when the voltage on said first input terminal exeeds the voltage on said first power terminal by more than said predetermined voltage differential.

22. The differential amplifier recited in claim 21 wherein said first power terminal is connected to said second input terminal.

* * * * *